United States Patent [19]
Persons

[11] Patent Number: 5,917,331
[45] Date of Patent: *Jun. 29, 1999

[54] INTEGRATED CIRCUIT TEST METHOD AND STRUCTURE

[75] Inventor: Thomas Walkley Persons, Los Altos, Calif.

[73] Assignee: Megatest Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/546,751

[22] Filed: Oct. 23, 1995

[51] Int. Cl.⁶ .................................................. G01R 31/28
[52] U.S. Cl. ........................................ 324/765; 324/158.1
[58] Field of Search .................................. 324/771, 73.1, 324/758, 765, 158.1, 115

[56] References Cited

U.S. PATENT DOCUMENTS

| | | | |
|---|---|---|---|
| 3,573,563 | 4/1971 | Hovorka | 361/192 |
| 3,652,080 | 3/1972 | Jenkins | 493/14 |
| 3,697,772 | 10/1972 | Gibbs | 327/417 |
| 4,001,683 | 1/1977 | McNeilly | 324/115 |
| 4,862,070 | 8/1989 | Ostertag | 324/73 R |
| 5,057,774 | 10/1991 | Verhelst et al. | 324/158 R |
| 5,272,584 | 12/1993 | Austruy et al. | 361/58 |
| 5,294,883 | 3/1994 | Akiki et al. | 324/158 R |
| 5,355,036 | 10/1994 | Gata | 327/384 |
| 5,467,024 | 11/1995 | Swapp | 324/771 |
| 5,754,041 | 5/1998 | Kaito et al. | 324/765 |

*Primary Examiner*—Ernest F. Karlsen
*Attorney, Agent, or Firm*—Flehr Hohbach Test Albritton & Herbert LLP

[57] ABSTRACT

A power supply for testing an integrated circuit includes a source voltage input terminal for receiving an input voltage. A plurality of switches are coupled in parallel to the input terminal, where each of the switches is coupled to an associated resistor. Each resistor, in turn, is coupled to an output terminal that is connected to the device under test (DUT). A soft switch is connected to both the input terminal and output terminal, where the soft switch is configured to condition the output terminal voltage when one of the switches is opened or closed. The soft switch quickly stabilizes the output voltage and reduces transients in the VDUT output signal.

9 Claims, 9 Drawing Sheets

INTEGRATED CIRCUIT TEST METHOD AND STRUCTURE

FIELD

The present invention pertains to electronic testing, and more specifically to testing the operational current (IDD) and quiescent current (IDDQ) of a CMOS integrated circuit.

BACKGROUND

A significant number of integrated circuits are fabricated utilizing CMOS circuitry due to the low power consumption of CMOS devices, particularly in the quiescent (non-switching) state. Testing a CMOS device quiescent power supply current (IDDQ) is a useful technique because excessively high IDDQ current may indicate a defect in the circuit that may result in premature failure of the circuit. An excessive IDDQ current might be caused by, for example, gate oxide leakage within the device indicating a poorly fabricated integrated circuit. Moreover, it has been determined that CMOS devices having high IDDQ may, although functional at the time of test, be unreliable and thus exhibit a shorter than desirable operating lifetime.

Integrated circuits, including CMOS integrated circuits, are typically extensively tested prior to shipment to a customer and installation in a multi-component electronic system. Given the large size of CMOS integrated circuits, the testing is extensive and is performed by sophisticated electronic test systems, such as the Polaris tester available from Mega Test Corporation of San Jose, Calif., the assignee of this invention.

Figure 1:
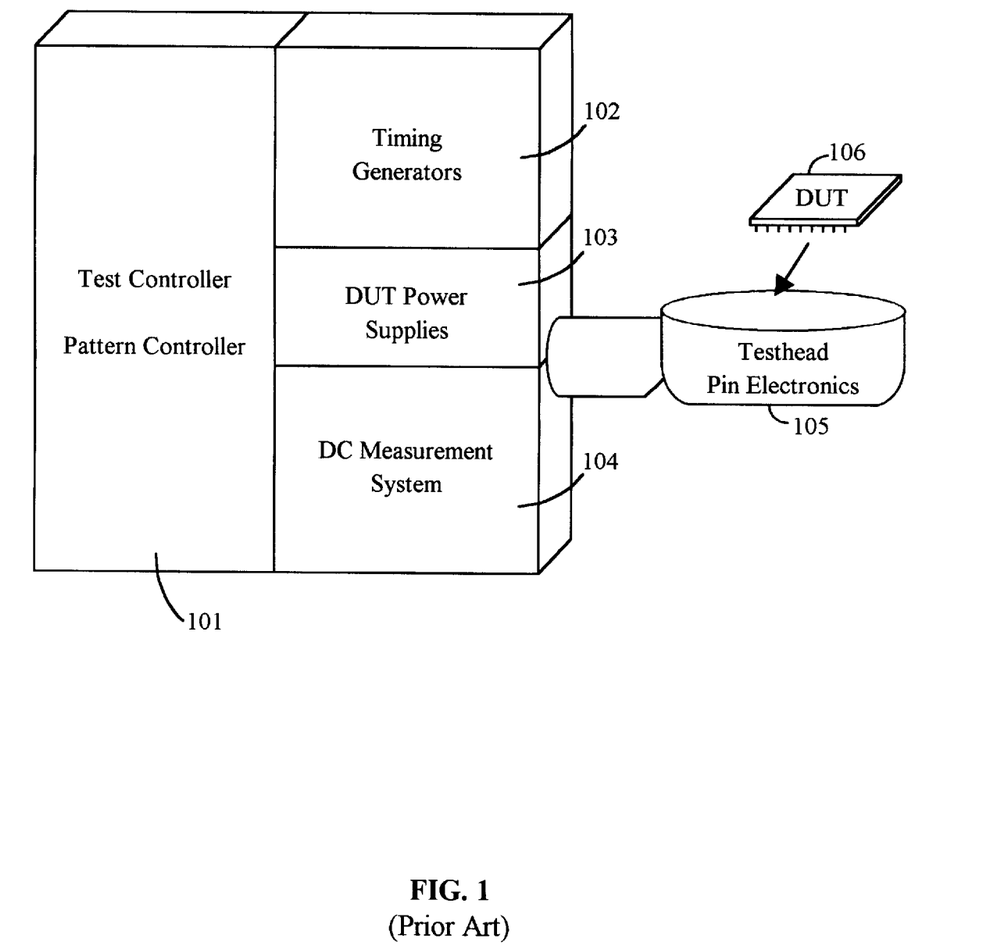
FIG. 1 depicts a general semiconductor test system according to the prior art.

A typical semiconductor test system depicted in FIG. 1 includes a test controller 101 which provides digital signals to control the operation of timing generators 102, a device under test (DUT) power supply 103, and DC measurement system 104 of the semiconductor test system. Subsections 102, 103, 104 are connected to test head pin electronics 105 which transmits highly accurate test signals to DUT 106 and monitors the pins of DUT 106 in order to measure voltages, currents and logic levels. In this manner, DUT 106 is tested for proper functionality under a wide range of operating conditions. The DUT power supply 103 of the semiconductor test system is programmable to provide desired voltage and current levels. The DC measurement system 104 is also programmable to provide appropriate current and voltage measurement ranges. One difficulty in such prior art test systems is that current measurement ranges vary considerably between high current ranges used to measure operational current IDD, such as output buffer current capacities, and the extremely low current ranges used to measure quiescent current IDDQ.

Figure 2:
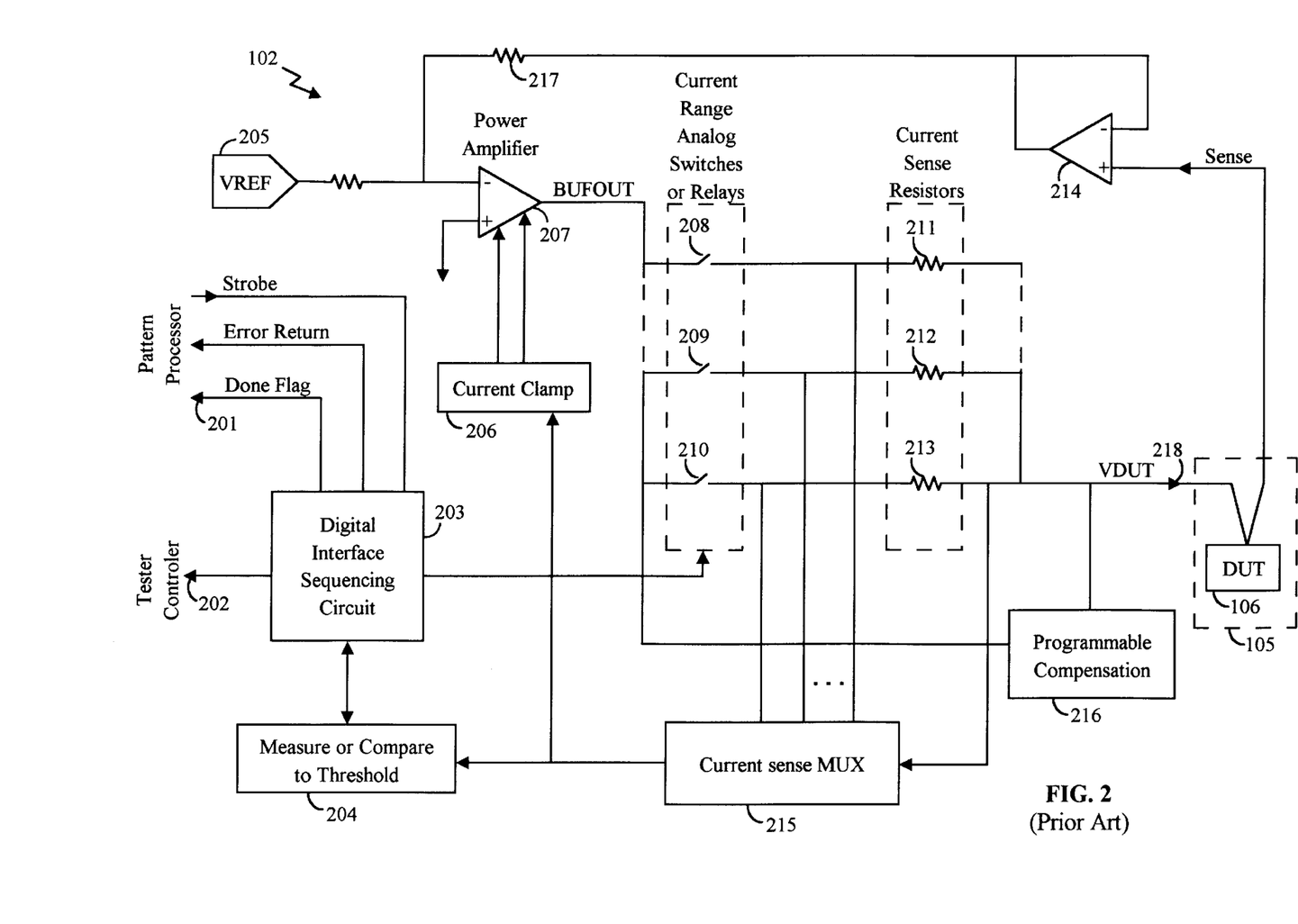
FIG. 2 depicts a test system power supply according to the prior art.

FIG. 2 is a block diagram depicting a typical prior art power supply 103 useful in measuring both high and low current ranges thereby suitable for use in measuring both IDD and IDDQ of a CMOS integrated circuit. As shown in FIG. 2, busses 201, 202 are used to communicate between the test controller/pattern processor 101 and digital interface/sequencing circuit 203. A voltage reference VREF is received on input terminal 205 and applied to power amplifier 207 to provide a buffered reference voltage output BUFOUT. This buffered output voltage is applied to a parallel array of current range analog switches 208, 209, 210, which are each coupled to current sense resistors 211, 212, and 213, respectively. The resistors are then coupled to VDUT output terminal 218 which provides a desired voltage to DUT 106. VDUT terminal 218 is also coupled to current sense multiplexer 215 which serves to monitor the voltage across, and thus the current through, current sense resistors 211, 212, and 213. A current sense signal is output from current sense multiplexer 215 and applied to comparison circuitry 204 to compare the current sense signal against a predetermined threshold. Comparison circuit 204 communicates with digital interface/sequencing circuit 203 in order to validate the current levels as acceptable, or to set an error flag when the current level is beyond the threshold. Current clamp 206 serves to control power amplifier 207 in response to the current sense output of current sense multiplexer 215 in order to prevent damaging the integrated circuit and the current sensor 204.

Buffer 214 receives a sense signal from the DUT voltage supply pins in order to correct for voltage losses in the force line at VDUT terminal 218. Buffer 214 also buffers the supply from a feedback resistor 217 to power amplifier 207. This type of connection is known in the art as a Kelvin Connection.

Figure 3:
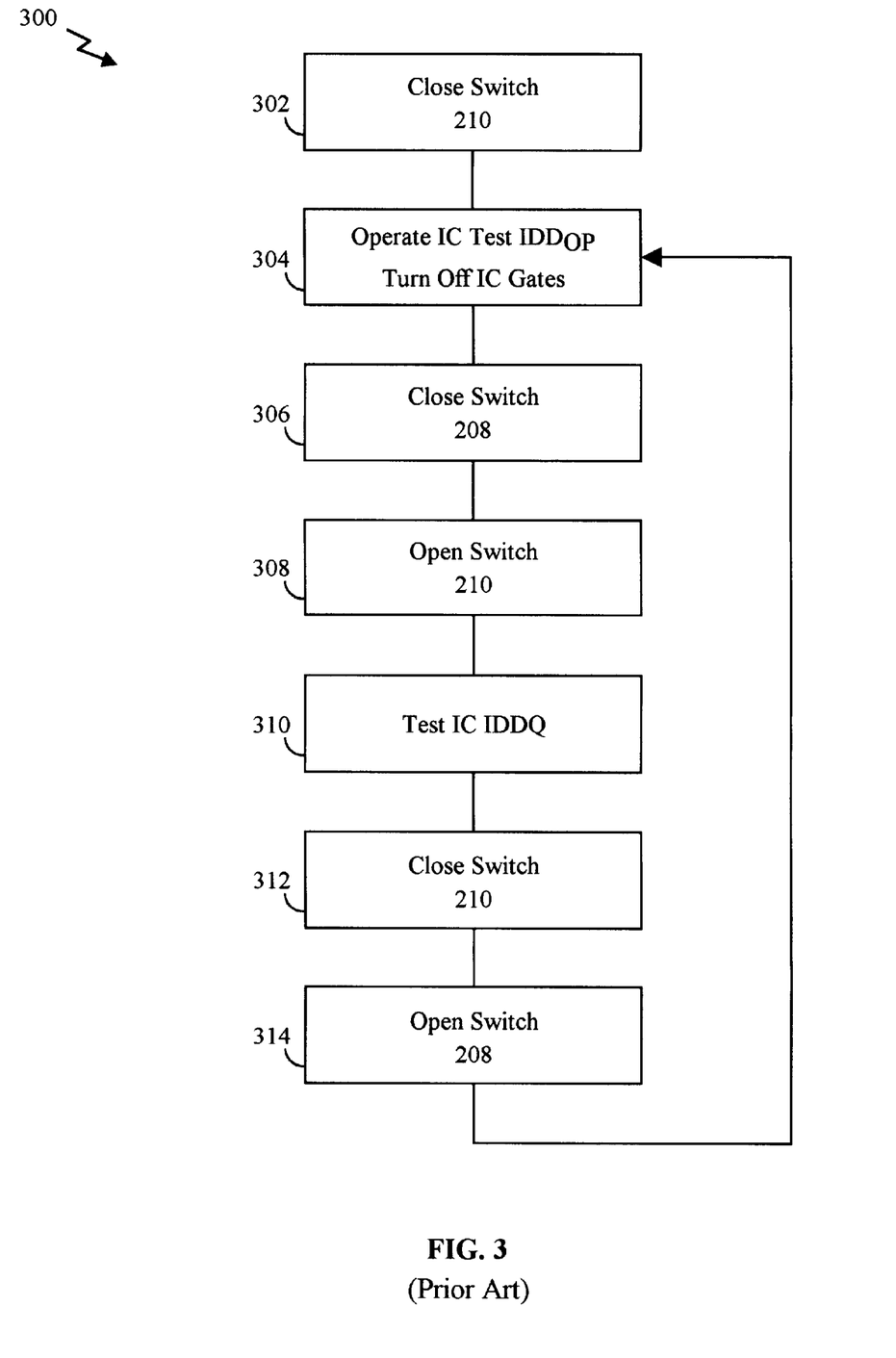
FIG. 3 is a flow chart showing steps performed by the power supply of FIG. 2.

During the operation of prior art circuit of FIG. 2, the integrated circuit is tested according to the flow chart of FIG. 3. In step 302, the power supply 103 is programmed to a high current range by closing switch 210, which is associated with a low value resistor 213. Then, in step 304, a test vector is executed to bring DUT 106 to a known state. A high current range resistor (low impedance value) is used during this period since DUT 106 is being exercised causing the internal transistors to turn on and off and thus utilize an operational supply current IDD. Ordinarily, various performance parameters of DUT 106 are measured during operational testing.

Once a desired state is achieved, also known as a test vector, the exercise is stopped, causing the device under test to cease switching its internal transistors. Step 306 closes switch 208 and the device under test power supply 102 is set to a low range, the IDDQ current range. In step 308, switch 210 is opened. A transient is created at the VDUT terminal when the switch 210 is opened due to accumulated charge in the switch. After the IDD current settles, in step 310, the quiescent current IDDQ is measured across resistor 211 by current sense multiplexer 215. If, as determined by comparison circuit 204, the measured IDDQ current is beyond the threshold, an indication signal is sent to digital interface 203 and appropriate action taken, for example by notifying the test engineer, or indicating that the part failed the IDDQ test.

Next, in steps 312 and 314, DUT power supply closes switch 210 and opens switch 208, and returns the procedure to step 304 where the power supply 103 is programmed back to a high current state. This switching causes another transient in the VDUT signal because of the impedance mismatch between the sensing resistors. Once the VDUT signal settles, testing is repeated with a different test vector established by the test controller 101 to test IDDQ based on different internal states so that a wide variety of defects can be detected.

As discussed briefly above, switching among the various sensing resistors causes transients to appear at the VDUT terminal. The prior art DUT power supply design (FIG. 2) which has IDDQ measurement capability causes transients in VDUT when a high impedance sense resistor 211 is switched out and a low impedance sense resistor 213 is switched in, and node voltages BUFOUT and VDUT are different. The difference between these voltages, before the switch is made, is equal to the IDDQ current times the IDDQ current sense resistor 211. When switch 208 is opened and switch 210 is closed, the current into VDUT terminal 218 becomes the difference between nodes BUFOUT and VDUT divided by the high current sense resistor 213. Since current sense resistor 213 is a much lower impedance than current sense resistor 211 and since BUFOUT is greater than VDUT at the switch time, the resulting current is large. This high current will continue until power amplifier 207 corrects BUFOUT to the appropriate level to maintain the VDUT voltage at the programmed level. Because a time delay is associated with the feedback loop to control the power amplifier, the surge of current will cause a voltage variation at VDUT terminal 218.

Figure 4:
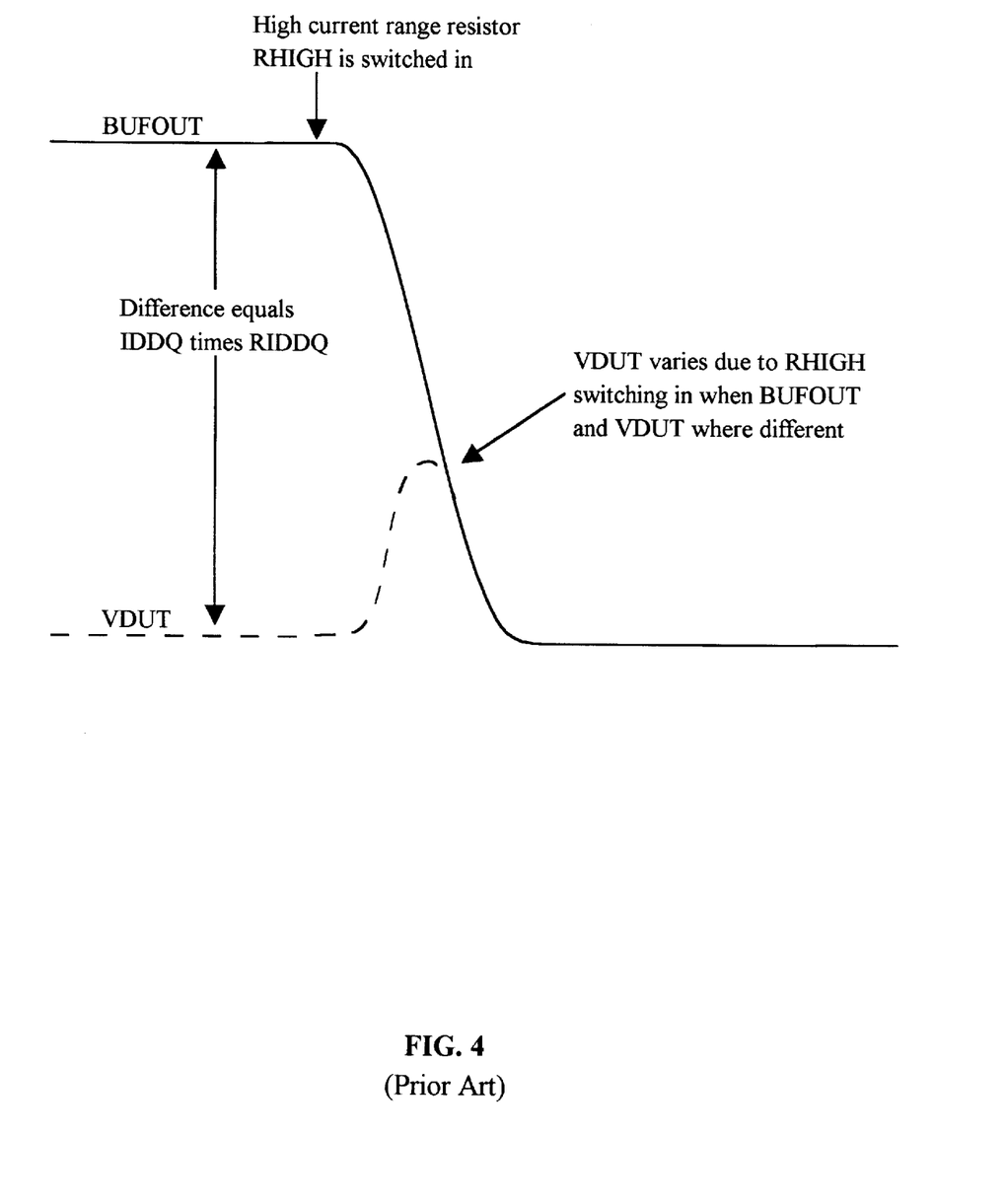
FIG. 4 is a graph showing the output current of the power supply of FIG. 2 with respect to time.

FIG. 4 shows a timing diagram depicting the operation of the prior art circuit of FIG. 2. When a transition is made during step 308 when switch 210 is opened, a transient is created at the VDUT terminal due to the accumulation of charge. Moreover, when a transition is made during steps 312 to 314, a transient is created at the VDUT terminal due to the mismatch in driving impedance.

The difference between the BUFOUT and VDUT voltage levels within the power supply 103 is the voltage appearing across the selected current sense resistor, with IDDQ being defined by $$IDDQ=(BUFOUT-VDUT)/RIDDQ,$$

where IDDQ is the resistance value of the selection current sense resistor. When the transition is made from step 312 to step 314, a lower value resistor 213 is placed in series with the CMOS integrated circuit. This lower value resistor 213 allows the VDUT voltage to increase because the power amplifier 207 (BUFOUT) had previously been driving a large value resistor 211, and consequently there was previously a large difference between the voltages BUFOUT and VDUT.

Moreover, as shown in FIG. 4, if current range switching is performed with solid state switches, a charge (ICHG) is injected into the system, causing a transient increase in the voltage level of VDUT. As a result, test time must be increased in order to allow his transient effect on VDUT to be discharged before a measurement is made. Increased test times increase the cost of test since fewer devices can be tested in a given amount of time on a given tester. While relays can be used rather than solid state switches as switches 208 through 210, charge injection will be much smaller but switching times will be much longer, also resulting in long test times. However, the life expectancy and reliability of relays is significantly less than that of solid state switches. Furthermore, under some conditions, noise will be injected into the DUT supply voltage when switching from an IDDQ measurement range to a higher current range. This noise makes the IDDQ test less reliable or requires a significant additional time for the IDDQ test since measurements cannot be made until the noise transients have dissipated.

SUMMARY

The present invention pertains to electronic testing, and more specifically to testing the operational current (IDD) and quiescent current (IDDQ) of a CMOS integrated circuit.

In accordance with the teachings of this invention, a novel method and structure are taught for switching a measurement current range of a device under test (DUT) power supply while conditioning the DUT supply voltage and reducing settling time and measurement time.

One embodiment of a power supply for testing an integrated circuit includes a source voltage input terminal for receiving an input voltage. A plurality of switches are coupled in parallel to the input terminal, where each of the switches is coupled to an associated resistor. Each resistor, in turn, is coupled to an output terminal that is connected to the DUT. A soft switch is connected to both the input terminal and output terminal, where the soft switch is configured to condition the output terminal voltage when one of the switches is opened or closed. The soft switch quickly stabilizes the output voltage and reduces transients in the VDUT output signal.

One embodiment of the soft switch is constructed from a diode bridge, controlled current sources and compensation capacitors which act as a soft connect and disconnect allowing the power supply to maintain a closed loop operation. Maintaining closed loop operation minimizes variations on the DUT power supply voltage. In one embodiment solid state switches are used to effect the current range switching to minimize current range switching time and improve reliability. The soft switching of the invention eliminates the longer settling times which were required in the prior art due to charge injection associated with the use of solid state switches.

Advantages of the invention include reduced settling time and improved output voltage control. These advantages further provide more efficient testing of integrated circuits by reducing the time necessary to properly test the circuits.

BRIEF DESCRIPTION OF THE DRAWINGS

Additional advantages of the invention will become apparent upon reading the following detailed description and upon reference to the drawings, in which.

DETAILED DESCRIPTION

The present invention pertains to electronic testing, and more specifically to testing the operational current (IDD) and quiescent current (IDDQ) of a CMOS integrated circuit.

Exemplary embodiments are described herein with reference to specific configurations. Those skilled in the art will appreciate that various changes and modifications can be made to the exemplary embodiments while remaining within the scope of the present invention.

Figure 5:
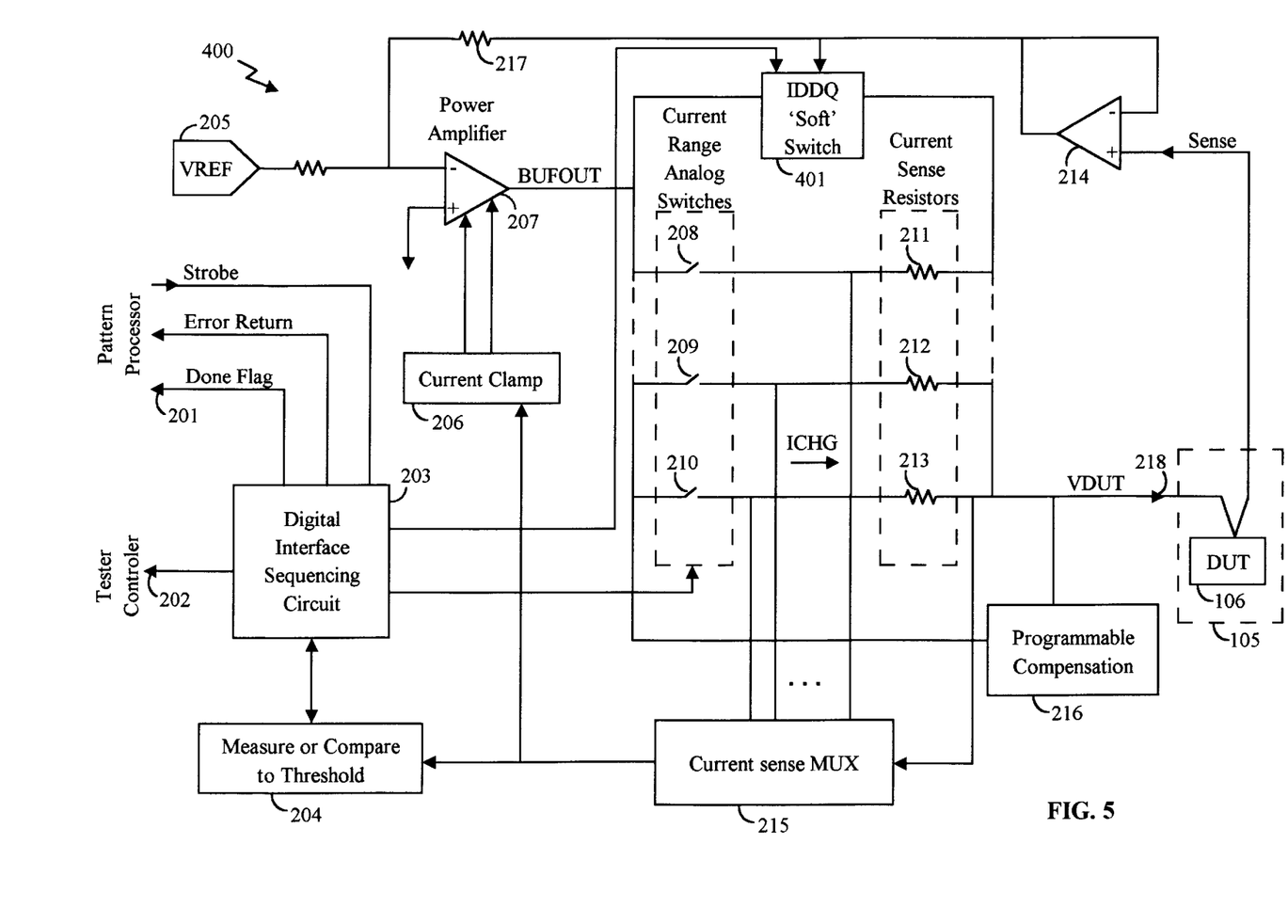
FIG. 5 depicts an embodiment of a power supply according to the invention.

One embodiment of a power supply 400 according to the invention is depicted in FIG. 5. Elements similar to those described with respect to the prior art power supply 103 of FIG. 2 are commonly numbered. The embodiment 400 includes a soft switch 401 that is designed to reduce the output transitions at VDUT when the power supply changes from one current range switch to another.

As noted above, the prior art power supply 103 caused transients at VDUT when switching between two current range settings. One solution to this problem is to reduce the voltage difference of BUFOUT and VDUT before switch 210 is switched ON. Power supply 400 accomplishes this function.

A soft switch 401 is placed between power amplifier 207 BUFOUT and VDUT terminal 218, parallel to switches 208–210. Soft switch 401 provides a low impedance path from BUFOUT to VDUT before switch 210 is switched ON. This low impedance reduces the voltage difference between voltages BUFOUT and VDUT so that when switch 210 is closed, little or no current is injected into VDUT terminal 218. Soft switch 401 must also be opened in a way that does not cause voltage transients at VDUT terminal 218. This is achieved by designing power supply 400 to have closed loop operation. Closed loop operation means that power amplifier 207 and soft switch 401 receive a feedback signal to maintain control of the VDUT voltage. Power amplifier 207 can then maintain the programmed voltage at VDUT and minimize output transients. This is done by turning on or off soft switch 401 at a rate that is slower than the response time of power amplifier 207 and allowing soft switch 401 to correct for impedance changes between nodes BUFOUT and VDUT. This design results in advantages including fewer transients and faster settling times at VDUT terminal 218 so that the IC testing can proceed quickly.

Figure 6A:
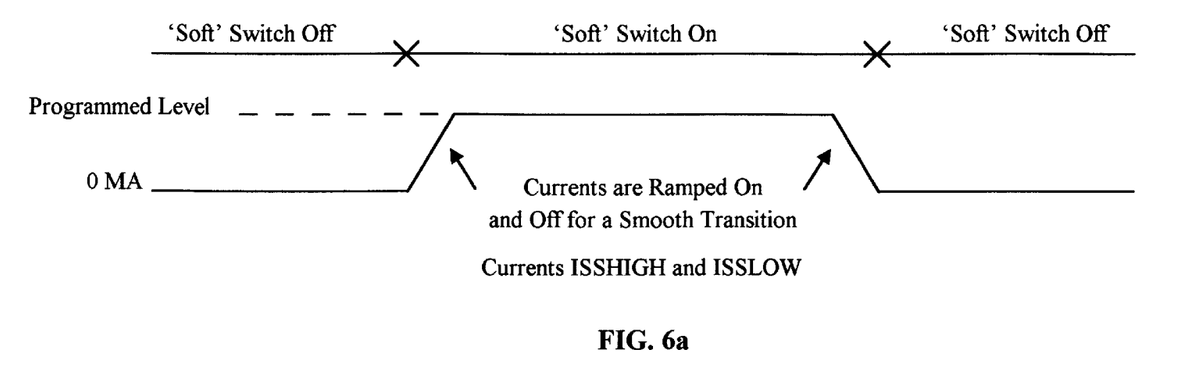
FIG. 6 depicts an embodiment of a soft switch according to the invention.
Figure 6B:
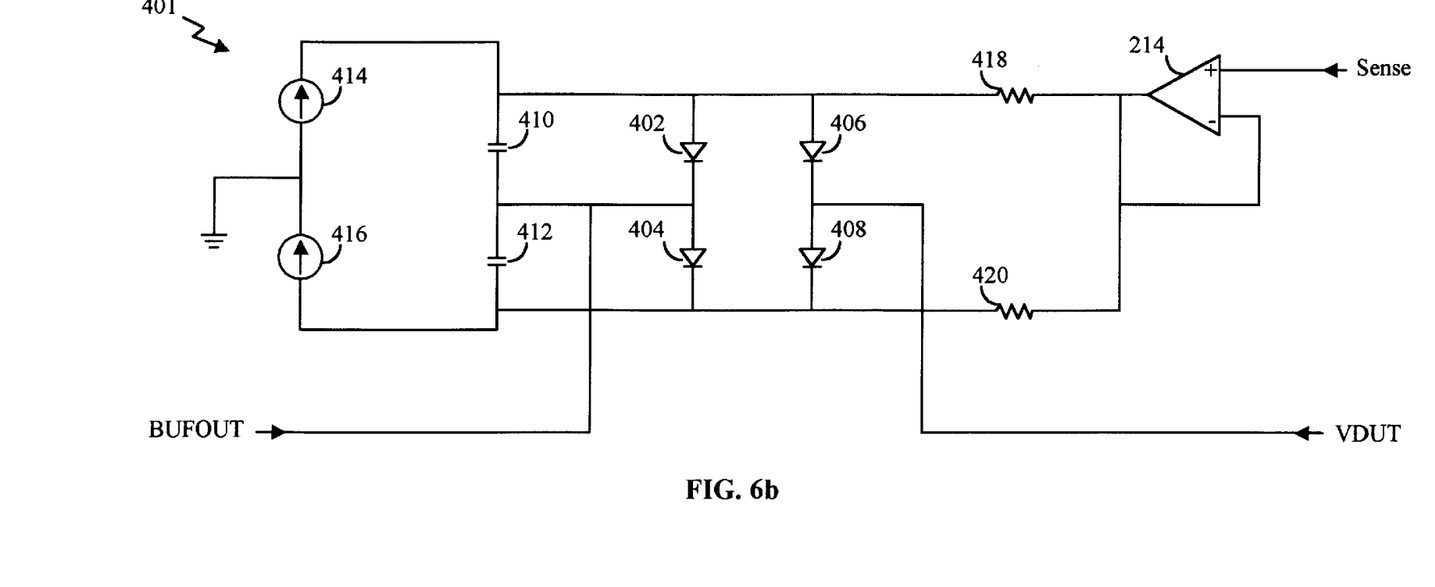

To accomplish the soft switch function, FIG. 6 depicts one embodiment of a soft switch 401 according to the invention. In order to reduce switching times and improve reliability, switch 210 is a solid state switch rather than a mechanical relay. The disadvantage of using a solid state switch is the charge current (ICHG) that it injects into the signal path the switch is opened, which causes voltage variations at node VDUT and increases settling times before IDDQ current measurements can be made. Soft switch 401 is a novel design that diverts ICHG from node VDUT into node BUFOUT to minimize voltage variations at node VDUT. The time switch 401 takes to discharge ICHG into BUFOUT is much less than the time to discharge the ICHG through the IDDQ current sense resistor 211.

Soft switch 401 has two current sources 414, 416 in series. A diode bridge includes four diodes 402–408 positioned such that diodes 402, 404 form a first series and diodes 406, 408 form a second series. A capacitor series 410, 412 is positioned in parallel with the diode bridge 402–408. BUFOUT is connected to the middle of the first diode series 402, 404 and to the middle of the capacitor series 410, 412. VDUT is connected to the middle of the second diode series 406, 408. The P side of the PN diode bridge is connected to current source 414 and amplifier 214 output via resistor 418. The N side of the PN diode bridge is connected to the current source 416 and amplifier 214 output via resistor 420.

The switching rate of soft switch 401 is controlled by current sources 414 and 416 and compensation capacitors 410 and 412. Charge current ICHG represents charge injection current caused by solid state switch 210 being opened. The magnitude of the current is typically 1–5 mA and lasts for about 50 us. Typical dynamic resistance of diodes 402, 404, 406 and 408 is 5 Ohms and typical resistance of power amplifier 207 is 0.2 Ohm. Therefore the typical resistance from VDUT to BUFOUT would be 5.2 Ohms. The worst case voltage imposed on node VDUT would then be 1 to 5 mA times 5.2 Ohms or 5.2 mV to 26 mV. This is low enough to avoid charge injection and promote fast settling times. Without soft switch 401, this voltage would be greater since the resistance from VDUT to BUFOUT would be equal to IDDQ sense resistor 208.

Soft switch 401 includes current supplies 414 and 416 that are typically 1 to 10 mA, for example. Although the current sources are fixed in this embodiment, a programmable current source is envisioned that would permit soft switch 401 to react to different operational requirements. Typical values of capacitors 410 and 412 are 0.1 to 10 $\mu$F, and typical values of resistors 418 and 420 are 100 to 10 K Ohms.

Figure 7:
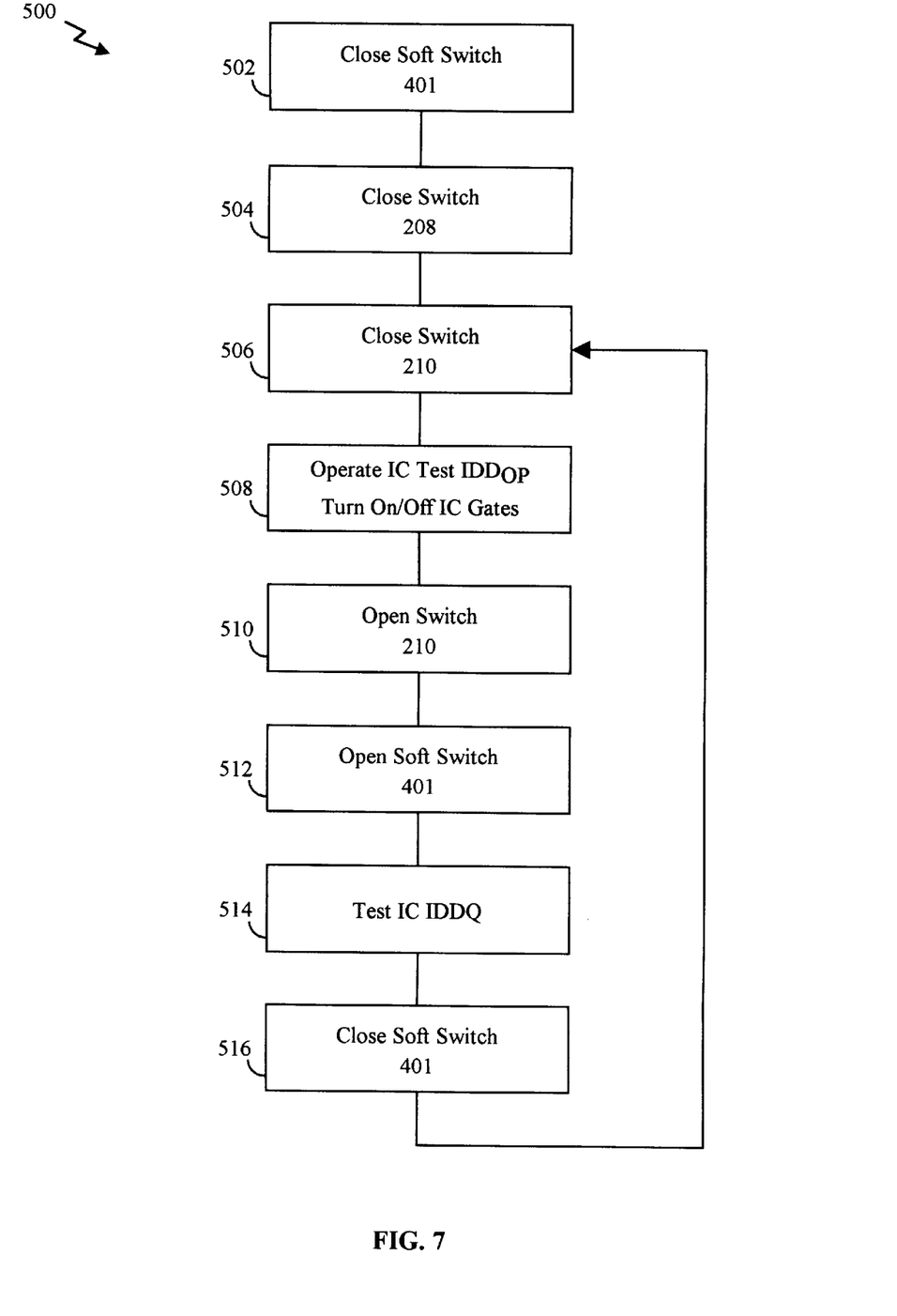
FIG. 7 is a flow chart showing steps performed by the power supply of FIG. 5.

FIG. 7 is a flow chart showing steps performed by the power supply of FIG. 5. In step 502 soft switch 401 is closed. In step 504, switch 208 is closed. In step 506, switch 210 is closed to supply the CMOS circuit with operational current IDD. The soft switch is activated during all switched among the various current sensor resistors to insure smooth transition. In step 508, the CMOS device is conditioned for an IDDQ test. A test pattern is run with the DUT until a desired internal state (test vector) is reached. The DUT will require a high current while the pattern is run, which requires the DUT supply to be set to a high current range (switch 210 closed).

After the desired state is achieved, the DUT current will decrease to the IDDQ current level. Step 510 opens switch 210. During this time, soft switch 401 absorbs any charge injected from switch 210 being turned off and ensures that a smooth transition is made at VDUT output terminal 218. Once step 510 is completed, step 512 opens the soft switch. The IDDQ current is measured in step 514 and the IDDQ current is compared against a predetermined threshold by the comparator 204.

After the measurements are complete, step 516 closes soft switch 401, and returns the processing to step 506 where the operational testing procedure is repeated. This iterative procedure continues until the test controller 101 determines that all the required test states are completed and the CMOS integrated circuit passes or fails the various tests.

Figure 8:
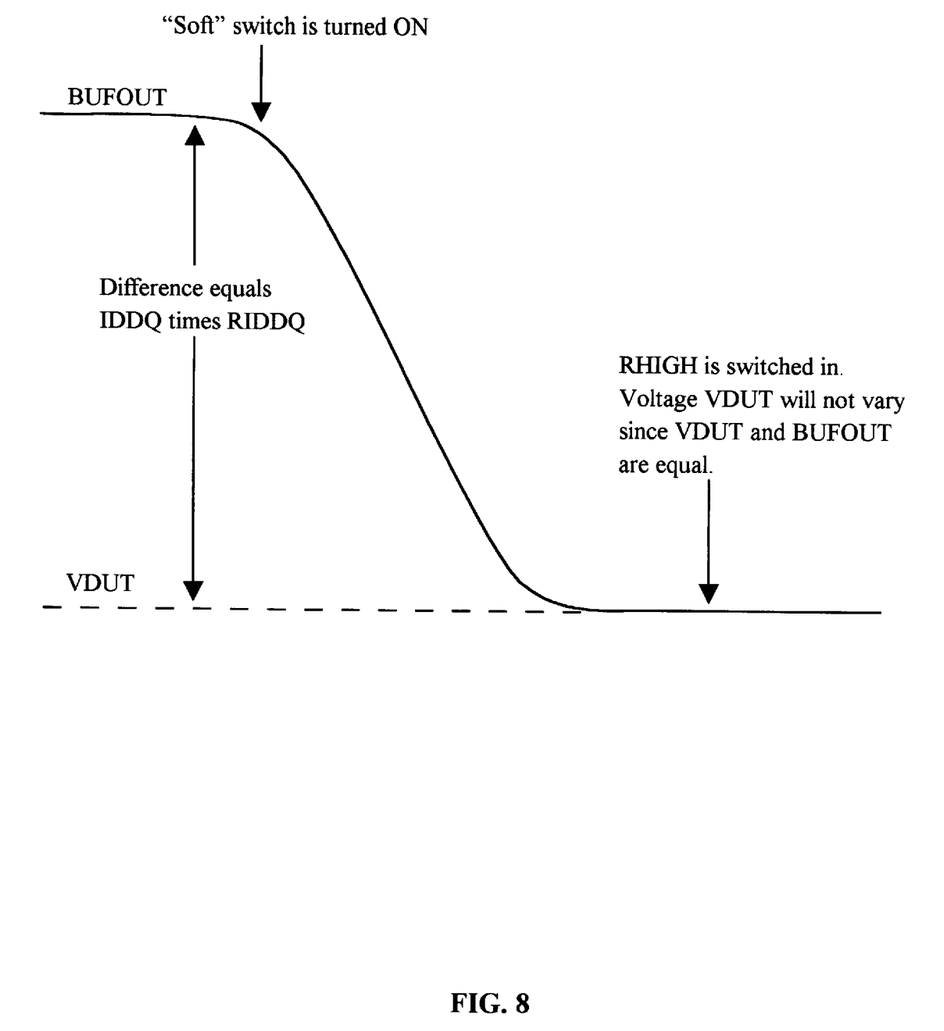
FIG. 8 is a graph showing the output current of the power supply of FIG. 5 with respect to time.

FIG. 8 is a graph showing the output current of the power supply of FIG. 5 with respect to time. When a transition is made during steps 516 and 506, during which time switch 210 is closed, soft switch 401 insures that a smooth transition is made at the VDUT terminal 218. Moreover, when a transition is made during steps 516 to 506, the soft switch 401 insures a smooth transition at the VDUT terminal 218 by smoothing the output impedance mismatch.

Figure 9:
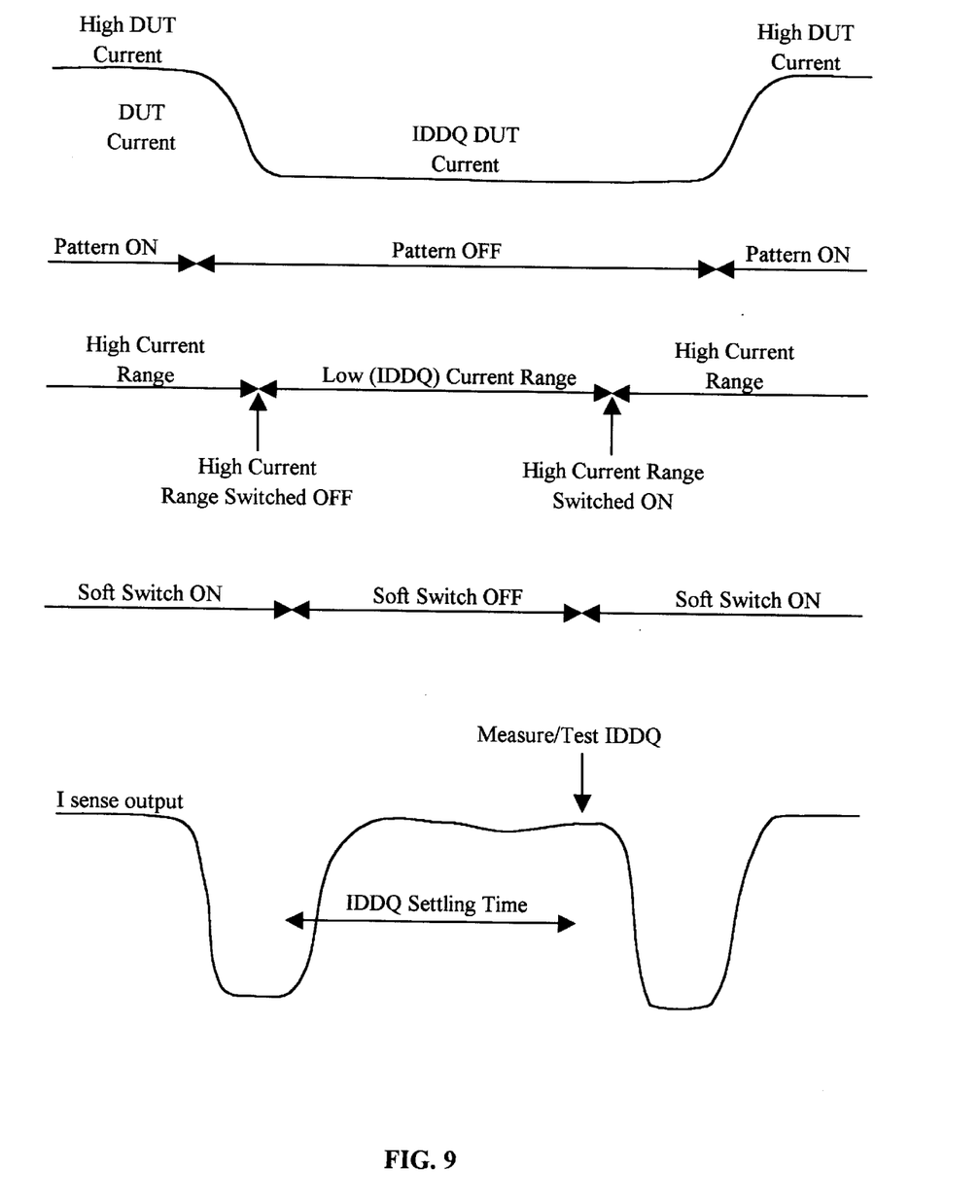
FIG. 9 is a graph showing the output current of the power supply of FIG. 5 with respect to time.

FIG. 9 is a graph showing the output current of the power supply of FIG. 5 with respect to time. This graph shows the conditioned nature of VDUT and how soft switch 401 smooths the VDUT signal during current range switch changes.

ALTERNATIVE EMBODIMENTS

Having disclosed exemplary embodiments and the best mode, modifications and variations may be made to the disclosed embodiments while remaining within the scope of the present invention as defined by the following claims.

What is claimed is:

1. An apparatus for testing power supply current for an integrated circuit, comprising:
   a source voltage input terminal;
   a plurality of electronic switches coupled in parallel to said input terminal, each of said electronic switches having an associated resistor of a different predetermined resistance and being coupled to a first end of said associated resistor, each said resistor also having a second end coupled to an output terminal for coupling to an integrated circuit, said electronic switches and resistors defining respective measurement paths; and
   a soft switch coupled between said input terminal and said output terminal, said soft switch comprising a selectively conductive low impedance path for diverting charge from said output when switching from one measurement path to another measurement path.

2. The apparatus of claim 1, further comprising:

a power amplifier disposed between said input terminal, and said electronic switches and said soft switch so that said power amplifier is coupled to said input terminal, said electronic switches and said soft switch, said power amplifier responsive to an input terminal voltage and said output terminal voltage.

3. The apparatus of claim 2, wherein:

said soft switch is responsive to said output terminal voltage.

4. The apparatus of claim 1, wherein said soft switch comprises:

a diode bridge having a first diode series and a second diode series;

a first current source coupled to a first end of said diode bridge and a second current source coupled to a second end of said diode bridge;

a capacitor series positioned in parallel with said diode bridge;

a power amplifier input terminal connected between the ends of said first diode series and between the ends of said capacitor series; and a sense signal input terminal connected between the ends of said second diode series.

5. The apparatus of claim 4, wherein:

said first diode series is two diodes;

said second diode series is two diodes; and said capacitor series is two capacitors.

6. The apparatus of claim 2, wherein said soft switch comprises:

a diode bridge having a first diode series and a second diode series;

a first current source coupled to a first end of said diode bridge and a second current source coupled to a second end of said diode bridge;

a capacitor series positioned in parallel with said diode bridge;

a power amplifier input terminal connected between the ends of said first diode series and between the ends of said capacitor series; and a sense signal input terminal connected between the ends of said second diode series.

7. The apparatus of claim 6, wherein:

said first diode series is two diodes;

said second diode series is two diodes; and said capacitor series is two capacitors.

8. The apparatus of claim 3, wherein said soft switch comprises:

a diode bridge having a first diode series and a second diode series;

a first current source coupled to a first end of said diode bridge and a second current source coupled to a second end of said diode bridge;

a capacitor series positioned in parallel with said diode bridge;

a power amplifier input terminal connected between the ends of said first diode series and between the ends of said capacitor series; and a sense signal input terminal connected between the ends of said second diode series.

9. The apparatus of claim 8, wherein:

said first diode series is two diodes;

said second diode series is two diodes; and said capacitor series is two capacitors.

* * * * *